(12) United States Patent
Booth, Jr. et al.

(10) Patent No.: US 8,242,549 B2
(45) Date of Patent: Aug. 14, 2012

(54) DYNAMIC RANDOM ACCESS MEMORY CELL INCLUDING AN ASYMMETRIC TRANSISTOR AND A COLUMNAR CAPACITOR

(75) Inventors: Roger A. Booth, Jr., Hopewell Junction, NY (US); Kangguo Cheng, Albany, NY (US); Chengwen Pei, Hopewell Junction, NY (US); Geng Wang, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 387 days.

(21) Appl. No.: 12/700,807

(22) Filed: Feb. 5, 2010

(65) Prior Publication Data

US 2010/0207179 A1 Aug. 19, 2010

Related U.S. Application Data

(60) Provisional application No. 61/153,084, filed on Feb. 17, 2009.

(51) Int. Cl.
*H01L 27/108* (2006.01)

(52) U.S. Cl. ........................ 257/296; 438/197
(58) Field of Classification Search .......... 438/197, 438/199, 153, 154; 257/296
See application file for complete search history.

(56) References Cited

U.S. PATENT DOCUMENTS

| | | | |
|---|---|---|---|
| 6,018,186 A | 1/2000 | Hsu | |
| 6,034,389 A * | 3/2000 | Burns et al. | 257/301 |
| 6,156,604 A | 12/2000 | Forbes et al. | |
| 6,355,518 B1 | 3/2002 | Wu et al. | |
| 6,479,852 B1 | 11/2002 | Wu | |
| 6,841,443 B2 | 1/2005 | Temmler et al. | |
| 6,998,676 B2 * | 2/2006 | Kondo et al. | 257/329 |
| 7,425,740 B2 | 9/2008 | Liu et al. | |
| 7,719,059 B2 * | 5/2010 | Hofmann et al. | 257/351 |
| 7,993,999 B2 * | 8/2011 | Basker et al. | 438/199 |
| 2005/0224890 A1 * | 10/2005 | Bernstein et al. | 257/371 |
| 2007/0278572 A1 | 12/2007 | Ban et al. | |
| 2011/0298025 A1 * | 12/2011 | Haensch et al. | 257/296 |

* cited by examiner

*Primary Examiner* — Thao P. Le
(74) *Attorney, Agent, or Firm* — Scully, Scott, Murphy & Presser, P.C.; Joseph P. Abate, Esq.

(57) ABSTRACT

A semiconductor fin having a doping of the first conductivity type and a semiconductor column are formed on a substrate. The semiconductor column and an adjoined end portion of the semiconductor fin are doped with dopants of a second conductivity type, which is the opposite of the first conductivity type. The doped semiconductor column constitutes an inner electrode of a capacitor. A dielectric layer and a conductive material layer are formed on the semiconductor fin and the semiconductor column. The conductive material layer is patterned to form an outer electrode for the capacitor and a gate electrode. A single-sided halo implantation may be performed. Source and drain regions are formed in the semiconductor fin to form an access transistor. The source region is electrically connected to the inner electrode of the capacitor. The access transistor and the capacitor collectively constitute a DRAM cell.

20 Claims, 9 Drawing Sheets

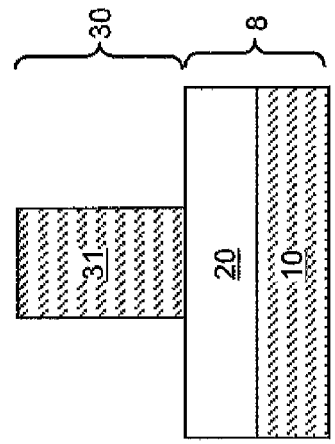
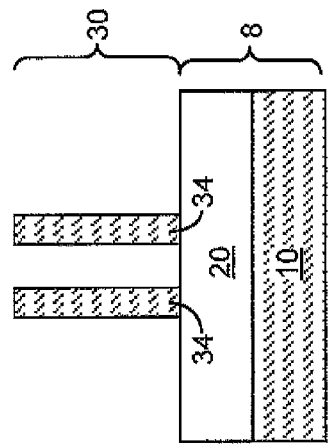
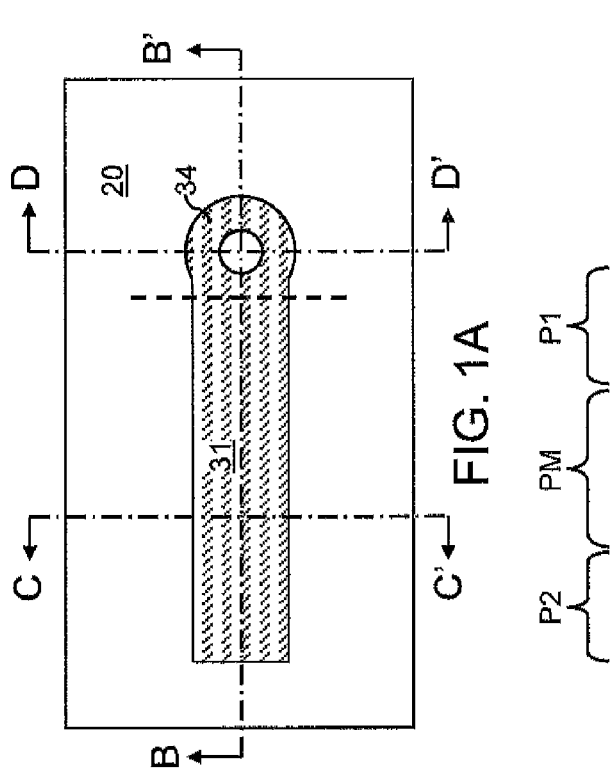
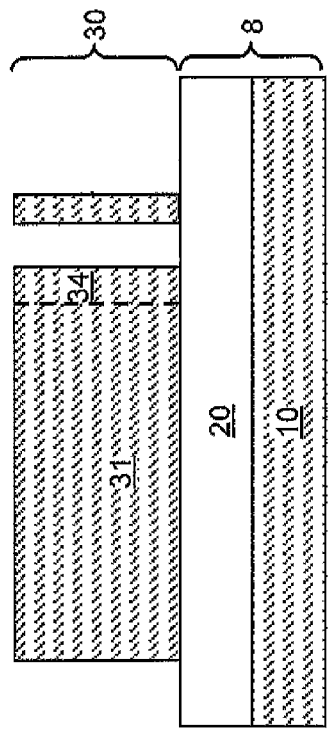

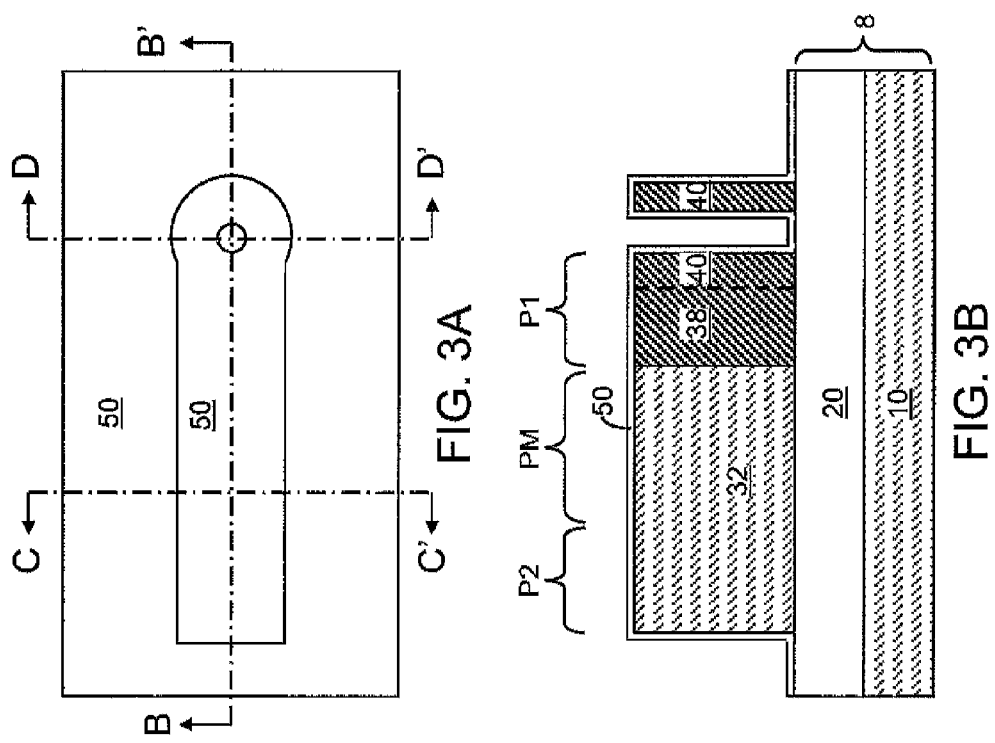

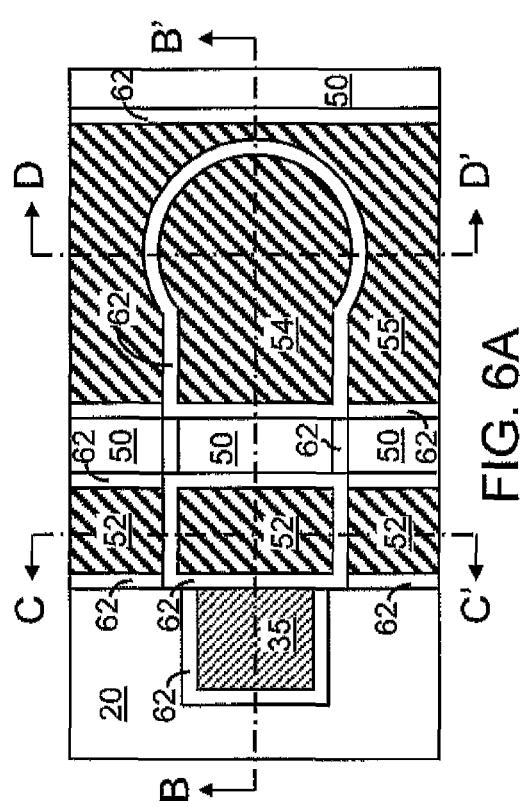
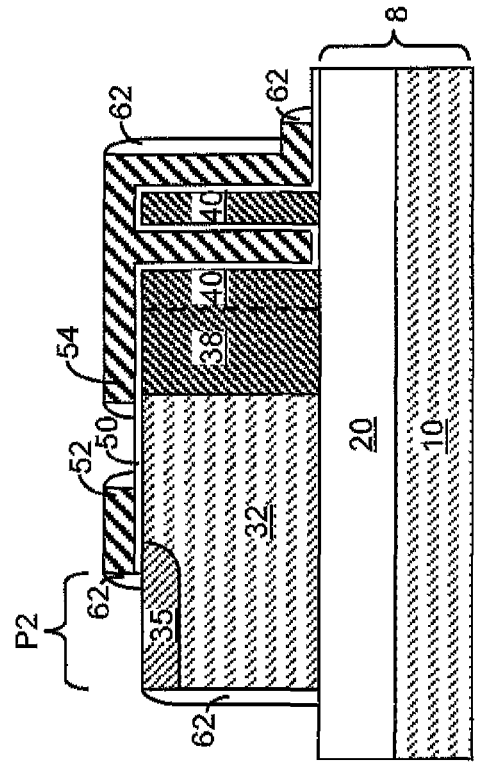
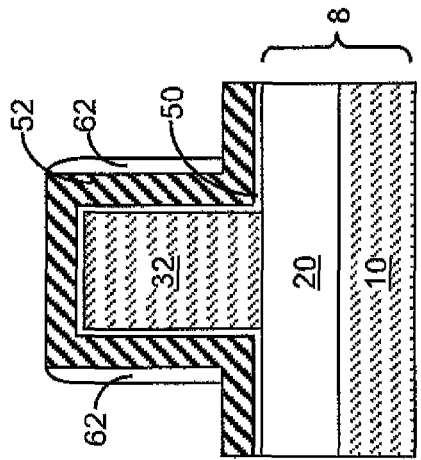
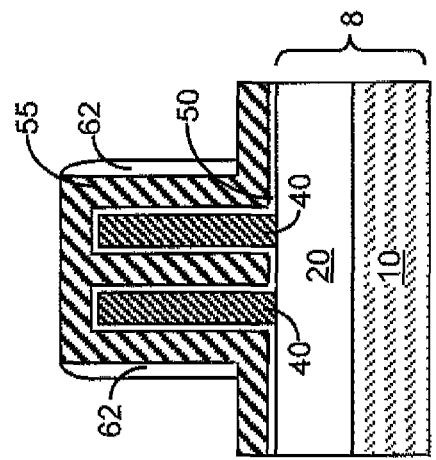
FIG. 6A
FIG. 6B
FIG. 6C
FIG. 6D

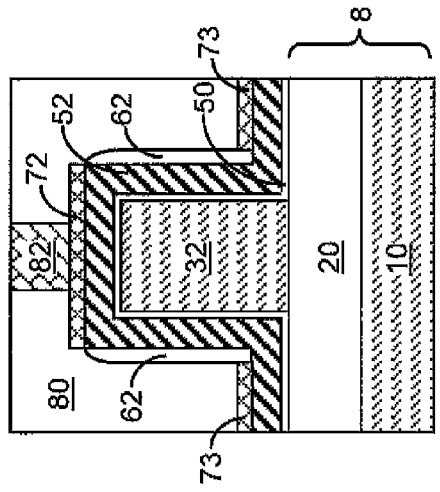
FIG. 8C
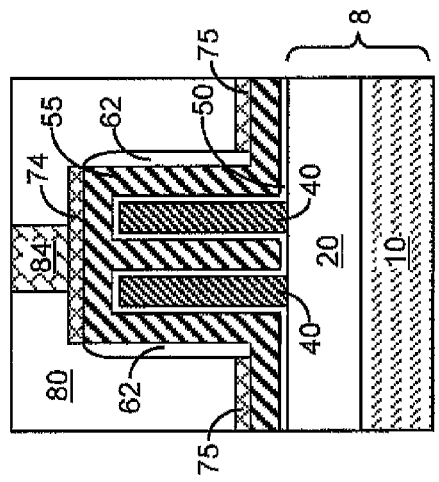
FIG. 8D
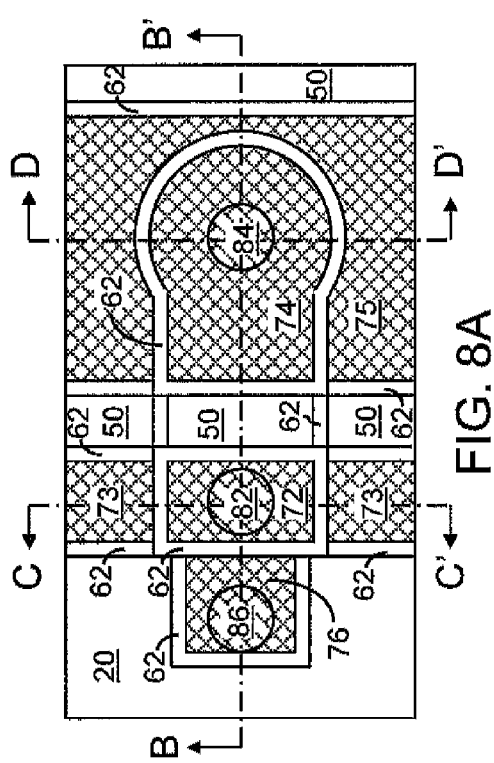
FIG. 8A
FIG. 8B
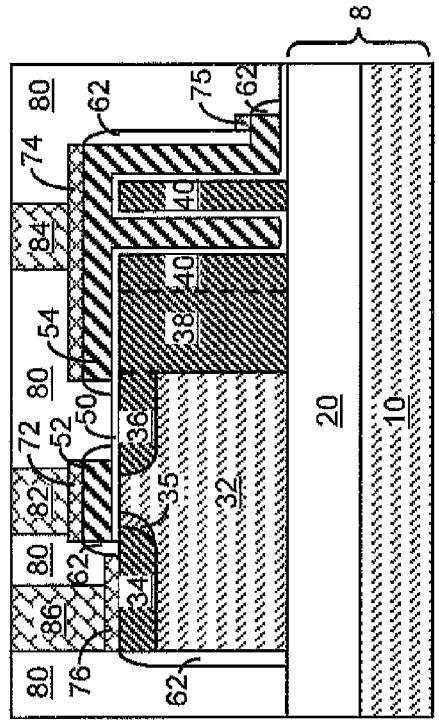

DYNAMIC RANDOM ACCESS MEMORY CELL INCLUDING AN ASYMMETRIC TRANSISTOR AND A COLUMNAR CAPACITOR

This non-provisional application claims the benefit of the provisional application filed with the U.S. Patent and Trademark Office as Ser. No. 61/153,084 entitled "DYNAMIC RANDOM ACCESS MEMORY CELL INCLUDING AN ASYMMETRIC TRANSISTOR AND A COLUMNAR CAPACITOR", filed Feb. 17, 2009.

FIELD OF THE INVENTION

The present invention relates to a semiconductor structure, and particularly to a dynamic random access memory (DRAM) cell structure and methods of manufacturing the same.

BACKGROUND OF THE INVENTION

Dynamic random access memory (DRAM) cells are employed in the semiconductor industry to provide a high density memory unit. An array of DRAM cells may be employed in a stand-alone memory chip, i.e., a dedicated DRAM chip. Alternately, an array of DRAM cells may be incorporated as embedded memory elements into an integrated semiconductor chip, which may include a processor unit.

Typical DRAM cells employ many unique processing steps, thereby significantly increasing processing time and processing cost for a semiconductor chip including such DRAM cells. In general, the less processing complexity and processing time a DRAM cell structure requires, the better the manufacturability of a semiconductor chip including such DRAM cells.

A challenge facing scaling of conventional DRAM cell structures is short channel effects. As the length of an access transistor controlling the current flow in a DRAM cell decreases with scaling, the short channel effect also increases, thereby increasing the off-current and/or decreasing the on-current. Increase in the off-current adversely impacts the retention time of a DRAM cell. Decrease in the on-current adversely impacts the access time of the DRAM cell. Reduction of the short channel effects is therefore a key consideration in the design of a DRAM cell.

SUMMARY OF THE INVENTION

The present invention provides a DRAM cell structure having a columnar capacitor and an asymmetric access transistor and methods of forming the same.

In the present invention, a semiconductor fin having a doping of the first conductivity type and a semiconductor column are formed on a substrate. The semiconductor column and an adjoined end portion of the semiconductor fin are doped with dopants of a second conductivity type, which is the opposite of the first conductivity type. The doped semiconductor column constitutes an inner electrode of a capacitor. A dielectric layer and a conductive material layer are formed on the semiconductor fin and the semiconductor column. The conductive material layer is patterned to form an outer electrode for the capacitor and a gate electrode. A single-sided halo implantation may be performed. Source and drain regions are formed in the semiconductor fin to form an access transistor. The source region is electrically connected to the inner electrode of the capacitor. The access transistor and the capacitor collectively constitute a DRAM cell.

According to an aspect of the present invention, a semiconductor structure is provided, which includes: a field effect transistor located on a semiconductor fin that is located on a substrate; a semiconductor column of integral construction with the semiconductor fin; an inner electrode including a doped semiconductor material and located in the semiconductor column; a dielectric layer of unitary construction located on the semiconductor fin and the semiconductor column; an outer electrode located directly on the dielectric layer and overlying the semiconductor column; and a gate electrode located directly on the dielectric layer and overlying a middle portion of the semiconductor fin.

According to another aspect of the present invention, a method of forming a semiconductor structure is provided, which includes: forming a semiconductor fin and a semiconductor column directly on a substrate, wherein the semiconductor column is of integral construction with the semiconductor fin; forming an inner electrode in the semiconductor column; forming a dielectric layer and a conductive layer on the semiconductor fin and the semiconductor column; and forming a field effect transistor and a capacitor, wherein the capacitor includes the inner electrode, a first portion of the dielectric layer, and an outer electrode formed on the dielectric layer, wherein the outer electrode and a gate electrode of the field effect transistor are formed by patterning the conductive layer, and wherein a second portion of the dielectric layer is a gate dielectric of the field effect transistor.

BRIEF DESCRIPTION OF THE DRAWINGS

FIGS. 1A-8D show sequential views of a first exemplary semiconductor structure according to a first embodiment of the present invention. Figures with the same numeric label correspond to the same stage of manufacturing. Figures with the suffix "A" are top-down views. Figures with the suffix "B," "C," or "D" are vertical cross-sectional views along the plane B-B', C-C', or D-D' respectively, of the corresponding figure with the same numeric label and the suffix "A." A middle-of-line (MOL) dielectric layer is omitted in FIG. 8A for clarity.

FIG. 9A is a top-down view. FIGS. 9B, 9C, and 9D are vertical cross-sectional views along the plane B-B', C-C', or D-D' respectively, of FIG. 9A.

DETAILED DESCRIPTION OF THE INVENTION

Figure 2C:
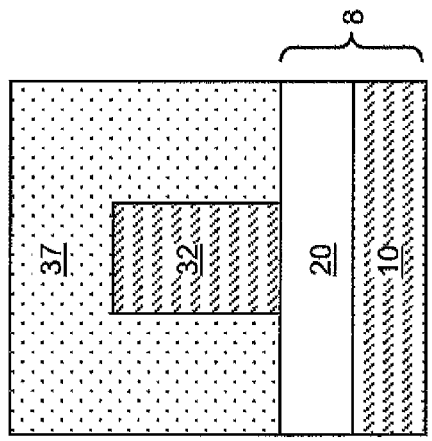

As stated above, the present invention relates to a dynamic random access memory (DRAM) cell structure and methods of manufacturing the same, which are now described in detail with accompanying figures. Throughout the drawings, the same reference numerals or letters are used to designate like or equivalent elements. The drawings are not necessarily drawn to scale.

Referring to FIGS. 1A-1D, a first exemplary interconnect structure according to the present invention includes a top semiconductor structure 30 and a substrate 8. The substrate includes an insulator layer 20 and a handle substrate 10. The top semiconductor structure 30 includes a semiconductor fin 31 and a semiconductor column 34. The insulator layer 20 is located in the substrate 8 and vertically abuts the bottom surface of the semiconductor fin 31 and the bottom surface of the semiconductor column 34. The top semiconductor structure 30 and the substrate 8 may be formed from a semiconductor-on-insulator (SOI) substrate. Specifically, a top semiconductor layer including a single crystalline semiconductor material may be patterned to form the top semiconductor structure 30.

The semiconductor material for the top semiconductor structure 30 may be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. For example, the semiconductor material may include single crystalline silicon.

The insulator layer 20 includes a dielectric material such as silicon oxide, silicon nitride, silicon oxynitride, or a combination thereof. The handle substrate 10 may include a semiconductor material, an insulator material, or a metallic material. In case the handle substrate 10 includes a semiconductor material, any semiconductor material described above for the top semiconductor structure 30 may be employed for the handle substrate 10. The semiconductor material for the handle substrate 10 may be the same as, or different from, the semiconductor material for the top semiconductor structure 30.

The semiconductor fin 31 has a pair of substantially parallel sidewalls. The semiconductor fin 31 has a first end portion P1 that laterally abuts the semiconductor column, a second end portion P2 that is located at an opposite end of the first end portion P1, and a middle portion PM between the first end portion P1 and the second end portion P2. Each of substantially parallel sidewalls extends from the first end to the second end. The semiconductor fin 31 and the semiconductor column 34 are of integral and unitary construction, i.e., in one piece. The entirety of the top semiconductor structure 30 is single crystalline. In other words, each of the semiconductor fin 31 and the semiconductor column 34 is single crystalline and epitaxially aligned to each other.

The semiconductor column 34 may have a polygonal or curvilinear shape for the outer periphery of the horizontal cross-sectional area. The semiconductor column 34 has at least one substantially vertical outer sidewall that is directly adjoined to the pair of substantially parallel sidewalls of the semiconductor fin 31. The semiconductor column 34 may have one or more holes within. The semiconductor column 34 has at least one substantially vertical inner sidewall within each hole therein. In this case, a horizontal cross-sectional area of the semiconductor column has an inner periphery for each hole. Each inner periphery may have a polygonal or curvilinear shape.

The semiconductor column 34 may have the same height as the semiconductor fin 31. In one case, the semiconductor column 34 may include at least one hole, which extends from a top surface of the semiconductor column 34 to a bottom surface of the semiconductor column 34. The top surface may be a topmost surface of the semiconductor column 34, which is substantially coplanar with the top surface of the semiconductor fin 31. The bottom surface may be a bottommost surface of the semiconductor column 34, which is substantially coplanar with the bottom surface of the semiconductor fin 31. In another case, the semiconductor column 34 may include at least one hole such that an inner sidewall of the semiconductor column 34 directly adjoins an inner periphery of the top surface of the semiconductor column 34 and an inner periphery of the bottom surface of the semiconductor column 34. Likewise, and outer sidewall of the semiconductor column 34 directly adjoins an outer periphery of the top surface of the semiconductor column 34 and an outer periphery of the bottom surface of the semiconductor column 34.

The semiconductor fin 31 and the semiconductor column 34 may be doped with electrical dopants. The doping type of the semiconductor fin 31 and the semiconductor column 34 is herein referred to as a first conductivity type. The first conductivity type may be p-type or n-type. Typically, the dopant concentration of the semiconductor fin 31 and the semiconductor column is from $1.0 \times 10^{14}/cm^3$ to $3.0 \times 10^{18}/cm^3$, and preferably from $3.0 \times 10^{15}/cm^3$ to $1.0 \times 10^{18}/cm^3$, although lesser and greater dopant concentrations are also contemplated herein.

The lateral width, i.e., the distance between the parallel sidewalls, of the semiconductor fin 31 may be from 30 nm to 500 nm, and typically from 60 nm to 200 nm, although lesser and greater widths are also contemplated herein. The height of the semiconductor fin 31 and the semiconductor column 34 may be from 100 nm to 4,000 nm, and typically from 200 nm to 800 nm, although lesser and greater thicknesses are also contemplated herein. The thickness of the insulator layer 20 may be from 100 nm to 4,000 nm, and typically from 200 nm to 800 nm, although lesser and greater thicknesses are also contemplated herein. The thickness of the handle substrate 10 may be from 50 μm to 1,000 μm, and typically from 400 μm to 800 μm, although lesser and greater thicknesses are also contemplated herein.

Figure 2D:
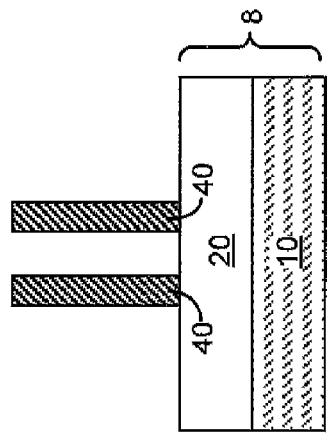
Figure 2A:
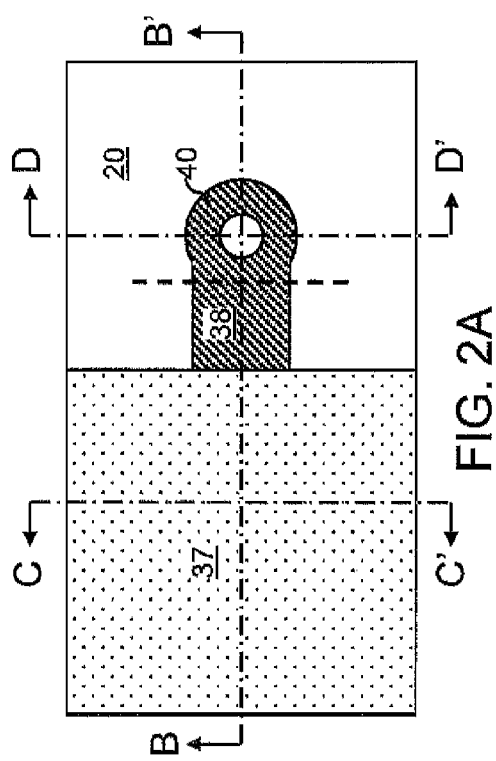
Figure 2B:
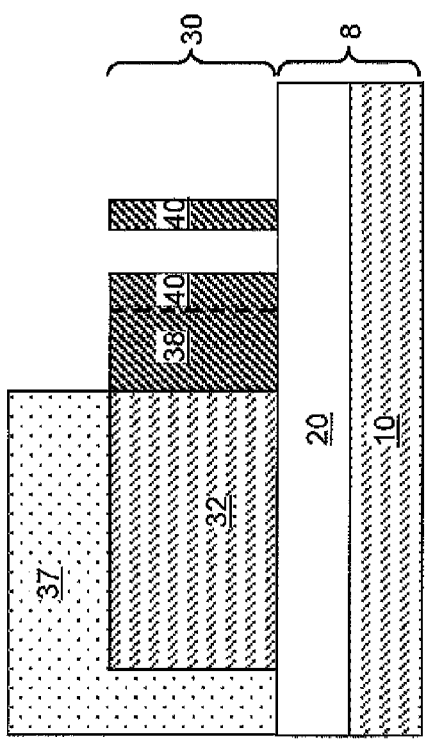

Referring to FIGS. 2A-2D, a first masking layer 37 is formed over the top semiconductor structure 30 and lithographically patterned to cover the second end portion P2 and the middle portion PM of the semiconductor fin 31, while exposing the first end portion P1 of the semiconductor fin 31 and the semiconductor column 34. The first masking layer 37 may be a photoresist layer that is patterned by lithographic exposure and development.

Dopants of a second conductivity type are implanted into the exposed portions of the top semiconductor structure 30. The second conductivity type is the opposite of the first conductivity type. If the first conductivity type is p-type, the second conductivity type is n-type, and vice versa. The dopants of the second conductivity type are implanted into the top surfaces and sidewall surfaces of the exposed portions of the semiconductor structure 30. The semiconductor column 34 as implanted with dopants of the second conductivity type is herein referred to as an inner electrode column portion 40. The first end portion P1 of the semiconductor fin 31 as implanted with dopants of the second conductivity type is herein referred to as an inner electrode fin portion 38. The inner electrode column portion 40 and the inner electrode fin portion 38 collectively constitute an inner electrode 40, which subsequently becomes an inner electrode of a capacitor as other elements are formed on the first semiconductor structure.

Typically, the dopant concentration of the inner electrode (38, 40) is from $1.0 \times 10^{19}/cm^3$ to $3.0 \times 10^{21}/cm^3$, and preferably from $3.0 \times 10^{19}/cm^3$ to $1.0 \times 10^{21}/cm^3$, although lesser and greater dopant concentrations are also contemplated herein. The remaining portion of the semiconductor fin 31, i.e., the middle portion PM and the second end portion P2 of the semiconductor fin 31, has a doping of the first conductivity type, and is a first conductivity type semiconductor region, and is herein referred to as a body region 32. The interface between the body region 32 and the inner electrode (38, 40) may be substantially vertical, and may vertically coincide with an edge of the first masking layer 37. The first masking layer 37 is subsequently removed. If the first masking layer 37 includes a photoresist, the first masking layer 37 may be removed selective to the top semiconductor structure (32, 38, 40), for example, by ashing. The semiconductor fin includes the body region 32 and the inner electrode fin portion 38. The semiconductor column includes the inner electrode column portion 40.

Referring to FIGS. 3A-3D, a dielectric layer 50 is formed on the top surfaces and sidewalls of the semiconductor fin (32, 38) and the inner electrode column portion 40. The dielectric layer 50 may be formed by conversion of a semiconductor material, deposition of a dielectric material, or a combination thereof. The dielectric layer 50 may be formed only on the top surfaces and sidewalls of the semiconductor fin (32, 38) and the inner electrode column portion 40, or may also be formed on the top surface of the insulator layer 50 so that the entirety of the first exemplary semiconductor structure is covered with the dielectric layer 50.

In one case, the dielectric layer 50 includes a dielectric material formed by thermal conversion of a portion of the semiconductor fin, such as silicon oxide or silicon nitride. Thermal oxidation, thermal nitridation, plasma oxidation, plasma nitridation, or a combination thereof may be employed to form the gate dielectric layer. In this case, the dielectric layer 50 is formed only on the sidewalls and top surfaces of the semiconductor fin (32, 38) and the inner electrode column portion 40. The thickness of the dielectric layer 50 may be from 0.8 nm to 10 nm, and typically from 1.1 nm to 6 nm.

In another case, the dielectric layer 50 may include a high-k dielectric material having a dielectric constant greater than 3.9, i.e., the dielectric constant of silicon oxide. The high-k dielectric material may include a dielectric metal oxide containing a metal and oxygen. Preferably, the dielectric constant of the high-k material is greater than or equal to 4.0. More preferably, the dielectric constant of the high-k dielectric material is greater than the dielectric constant of silicon nitride, which is 7.5. Even more preferably, the dielectric constant of the high-k dielectric material is greater than 8.0. The high-k dielectric materials are also known in the art as high-k gate dielectric materials, which include dielectric metal oxides, alloys thereof, and silicate alloys thereof. Exemplary high-k dielectric materials include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from 0.5 to 3 and each value of y is independently from 0 to 2. Optionally, an interfacial layer (not shown), for example, silicon oxide, can be formed by chemical oxidation or thermal oxidation before the high-k dielectric material is deposited. In this case, the dielectric layer 50 includes a single contiguous gate dielectric layer covering the entirety of the top surface and sidewall surfaces of the semiconductor fins 30 and the top surface of the insulator layer 20. In this case, the thickness of the dielectric layer 50 may be from 1 nm to 6 nm, and may have an effective oxide thickness on the order of 1 nm or less.

Figure 4C:
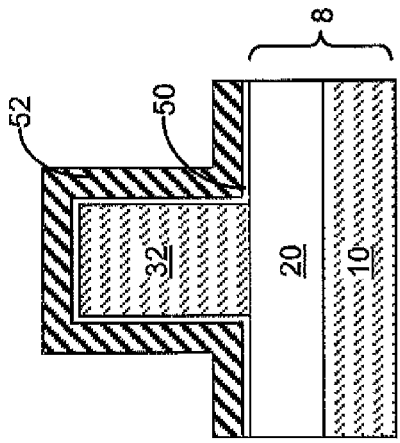
Figure 4D:
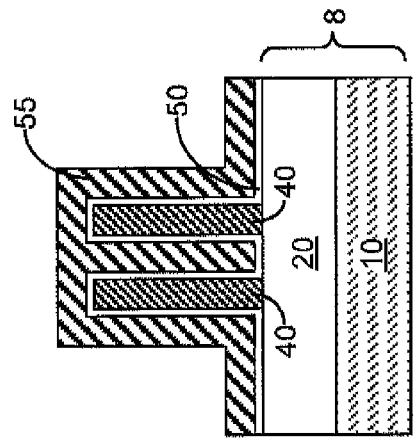
Figure 4A:
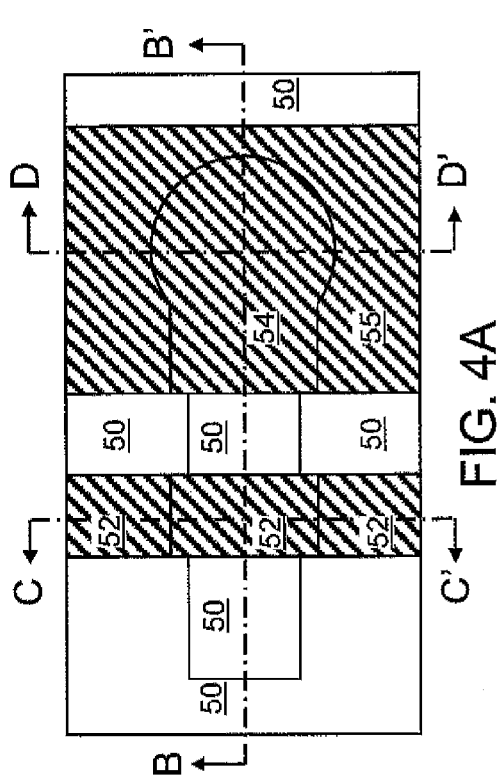
Figure 4B:
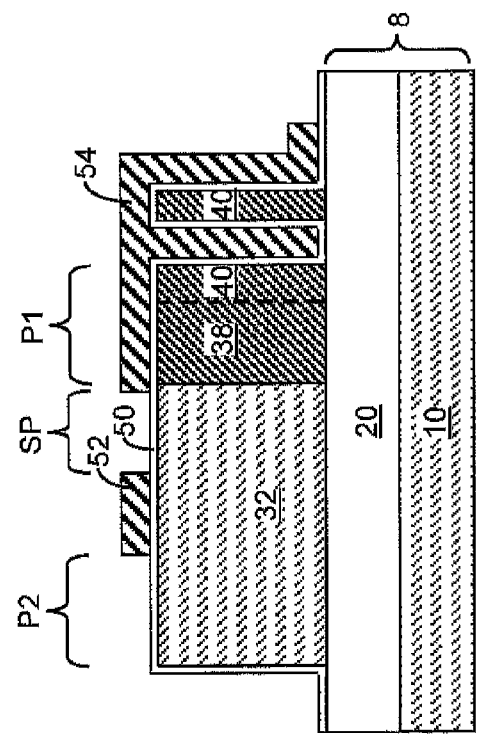

Referring to FIGS. 4A-4D, a conductive layer is deposited over the surfaces of the dielectric layer 50, and is lithographically patterned to form a gate electrode 52 and an outer electrode 54. Specifically, the conductive layer is deposited over the entire surface of the dielectric layer 50. The conductive layer is contiguous over the entirety of the dielectric layer 50 and any horizontal surface of the insulator layer 20 that abuts the conductive layer, if any such area is present. The conductive layer may be formed by a conformal deposition or a non-conformal deposition. Correspondingly, the thickness of the conductive layer over the top surfaces of the semiconductor fin (32, 38) and the inner electrode column portion 40 may be the same as, or different from, the thickness of the conductive layer on the sidewalls of the semiconductor fin (32, 38) and the inner electrode column portion 40. The outer electrode 54 and the gate electrode 52 include a same conductive material. A topmost surface of the gate electrode 52 is substantially coplanar with a topmost surface of the outer electrode 54. The thickness of the gate electrode 52 and the outer electrode 54, as measured above the top surfaces of the semiconductor fin (32, 38) and the inner electrode column portion 40, may be from 40 nm to 300 nm, and typically from 40 nm to 150 nm, although lesser and greater thicknesses are also contemplated herein.

A photoresist (not shown) is applied over the semiconductor fin (32, 38) and the inner electrode column portion 40 and lithographically patterned so that the second end portion P2 of the semiconductor fin (32, 38) and a sub-portion SP of the middle portion PM of the semiconductor fin (32, 38) are exposed, while the other sub-portion of the middle portion PM and the first end portion P1 of the semiconductor fin (32, 38) and the inner electrode column portion 40 are covered by the photoresist. The exposed portions of the conductive layer is removed by an etch employing the photoresist as an etch mask. The etch is preferably selective to the dielectric layer 50. The remaining portion of the conductive layer over the other sub-portion of the middle portion PM of the semiconductor fin (32, 38) constitutes the gate electrode 52, and the remaining portion of the conductive layer over the inner electrode column portion 40 constitutes the outer electrode 54. The outer electrode 54 may overlie the entirety of the first end portion P1 of the inner electrode fin portion 38 or a portion of the first end portion P1 of the inner electrode fin portion 38. The gate electrode 52 and the outer electrode 54 have the same thickness over the top surfaces of the semiconductor fin (32, 38) and the inner electrode column portion 40.

In one embodiment, the gate electrode 52 and the outer electrode 54 include an amorphous or polycrystalline semiconductor material such as polysilicon, amorphous silicon, a silicon-germanium alloy, a silicon-carbon alloy, a silicon-germanium-carbon alloy, or a combination thereof. The height of the gate electrode 52 and the outer electrode 54, as measured from the top surfaces of the semiconductor fin (32, 38) and the inner electrode column portion 40, may be from 30 nm to 300 nm, and typically from 60 nm to 150 nm, although lesser and greater thicknesses are also contemplated herein. The gate electrode 52 and the outer electrode 54 may be in-situ doped, or may be doped by a subsequent ion implantation of dopants. The gate electrode 52 and the outer electrode 54 are disjoined from each other, i.e., do not abut each other.

In another embodiment, the gate electrode 52 and the outer electrode 54 include a metal gate material, which includes a metallic conductive material. For example, the gate electrode 52 and the outer electrode 54 may include a material such as TaN, TiN, WN, TiAlN, TaCN, other conductive refractory metal nitride, or an alloy thereof. The metal gate material may be formed by chemical vapor deposition (CVD), physical vapor deposition (PVD), atomic layer deposition (ALD), etc. and including a conductive refractory metal nitride. The thickness of the metal gate material may be from 5 nm to 40 nm, and preferably from 10 nm to 30 nm. In case the gate electrode 52 and the outer electrode 54 include a high-k gate dielectric material, the metal gate material may be formed directly on the dielectric layer 50. The composition of the metal gate material may be selected to optimize threshold voltages of a field effect transistor to be subsequently formed on the semiconductor fin (32, 38). The gate electrode 52 and the outer electrode 54 may include both a metal gate material and a semiconductor material.

The gate electrode 52 extends laterally from the pair of substantially parallel sidewalls of the semiconductor fin (32, 38). In case the first exemplary semiconductor structure is implemented as an array including many dynamic random access memory (DRAM) cells, neighboring gate electrodes 52 may be electrically and/or physically adjoined to form a gate line. Likewise, neighboring outer electrodes 54 may be electrically and/or physically adjoined to form an extended outer electrode structure, which may be biased at the same voltage. For example, the extended outer electrode structure may be electrically grounded.

Preferably, the removal of the material of the conductive layer is performed selective to the dielectric layer 50 so that the dielectric layer 50 covers the top surface and sidewalls of the sub-portion SP of the middle portion PM of the semiconductor fin (32, 38) between the gate electrode 52 and the outer electrode 54. This may be effected by selecting an etch chemistry that removes the material of the conductive layer selective to the material of the dielectric layer 50 during the etch that patterns the gate electrode 52 and the outer electrode 54 from the conductive layer.

Figure 5C:
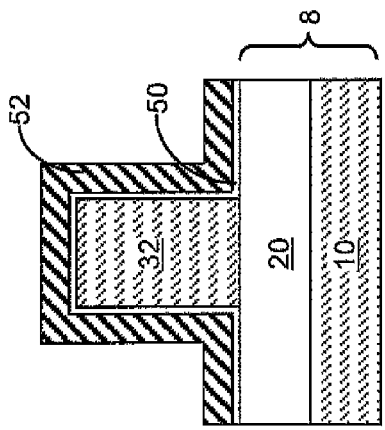
Figure 5D:
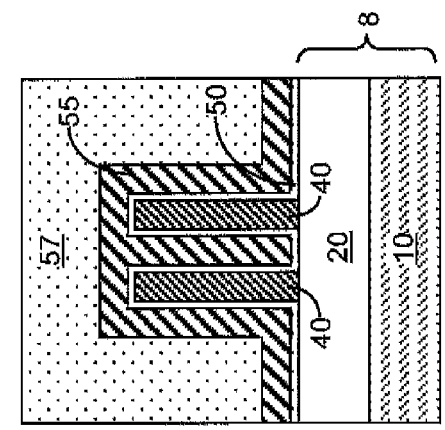
Figure 5A:
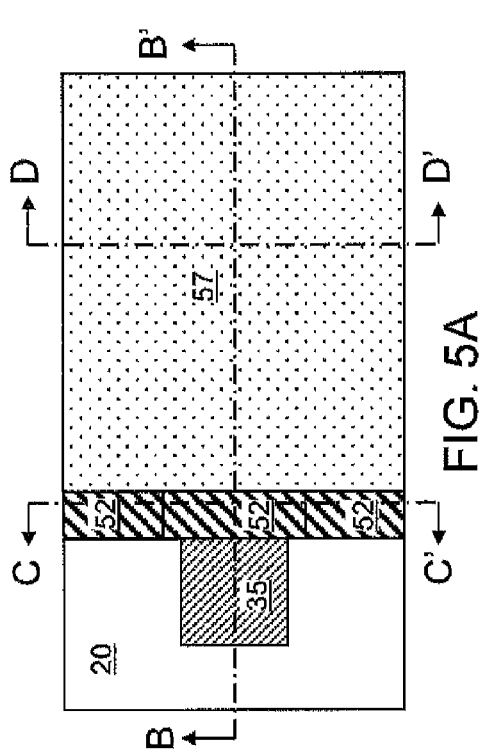
Figure 5B:
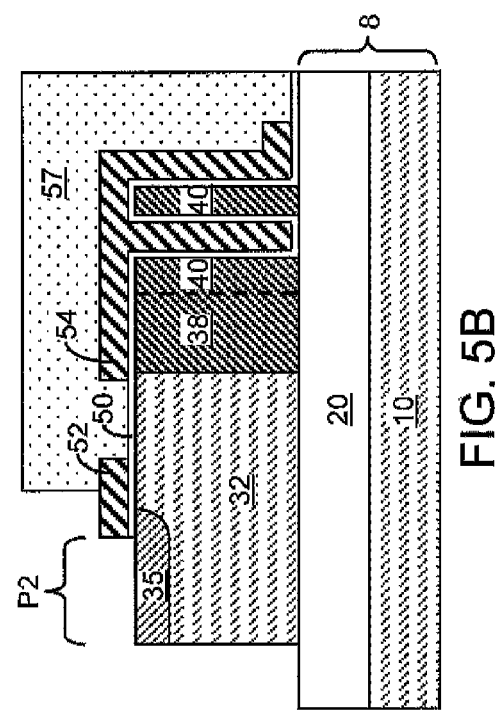

Referring to FIGS. 5A-5D, a second masking layer 57 is formed over the semiconductor fin (32, 38) and the inner electrode column portion 40 and lithographically patterned to cover the inner electrode fin portion 38 and the inner electrode column portion 40. The portion of the semiconductor fin (38, 40) between the gate electrode 52 and the outer electrode 54 is also covered by the second masking layer 57. An edge of the second masking layer 57 overlies the gate electrode 52. The second masking layer 57 may be a photoresist layer that is patterned by lithographic exposure and development.

Exposed portions of the dielectric layer 50 are removed by an etch employing the second masking layer 57 and the gate electrode 52 as an etch mask. The etch may be an isotropic etch or an anisotropic etch. Preferably, the etch is an isotropic etch. Surfaces of the second end portion P2 of the semiconductor fin (32, 38) are exposed after the etch.

Dopants of the first conductivity type are implanted into the exposed surfaces of the body region 32 to form a halo region 35, which has a doping of the first conductivity type at a greater dopant concentration than the body region 32 due to the additionally implanted first conductivity type dopants. The atomic concentration of first conductivity type dopants in the halo region 35 may be from $1.0 \times 10^{16}/cm^3$ to $1.0 \times 10^{20}/cm^3$, and preferably from $3.0 \times 10^{17}/cm^3$ to $3.0 \times 10^{19}/cm^3$, although lesser and greater dopant concentrations are also contemplated herein. The second masking layer 57 is subsequently removed.

Optionally, source and drain extension regions (not shown) may be formed by implantation of dopants of the second conductivity type employing the gate electrode 52 and the outer electrode 54 as an ion implantation mask. The depth of ion implantation for the source and drain regions is less than the depth of the ion implantation for the halo region 35.

Referring to FIGS. 6A-6D, a dielectric spacer 62 is formed on the sidewalls of the gate electrode 52, the outer electrode 54, and the semiconductor fin (32, 38). Formation of the dielectric spacer 62 may be effected by deposition of a dielectric material layer by a conformal deposition followed by an anisotropic etch that removed horizontal portions of the dielectric material layer. Preferably, the anisotropic etch employed to removed the horizontal portions of the dielectric material layer is selective to the semiconductor material of the semiconductor fin (35, 32, 38), and the conductive material of the gate electrode 52 and the outer electrode 54.

The dielectric spacer 62 abuts substantially vertical sidewalls of the semiconductor fin (35, 32, 38), sidewalls of the gate electrode 52, and sidewalls of the outer electrode 62. The dielectric spacer 62 laterally surrounds and laterally encloses the outer electrode 54 and a portion of the gate electrode 52 above the semiconductor fin (35, 32, 38). The portion of the dielectric spacer 62 that laterally surrounds the outer electrode 54 is contiguous with the portion of the dielectric spacer 62 that laterally surrounds the portion of the dielectric spacer 62 that laterally surrounds the gate electrode 52. A portion of the bottom surface of the dielectric spacer 62 formed directly on the second end portion P2 of the semiconductor fin (35, 32, 38) vertically abuts a top surface of the insulator layer 20.

The lateral thickness of the of the dielectric spacer 62, as measured on the sidewalls of the second end portion P2 of the semiconductor fin (35, 32, 38) and directly above the insulator layer 20, may be from 10 nm to 150 nm, and typically from 20 nm to 75 nm, although lesser and greater lateral thicknesses are also contemplated herein.

Figure 7C:
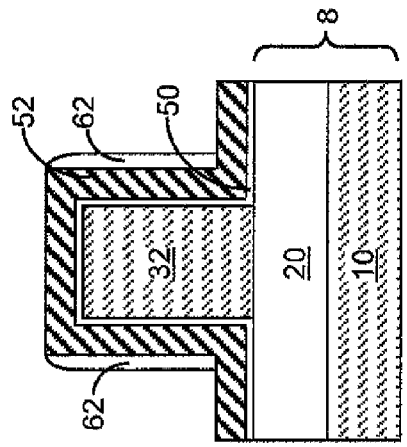
Figure 7D:
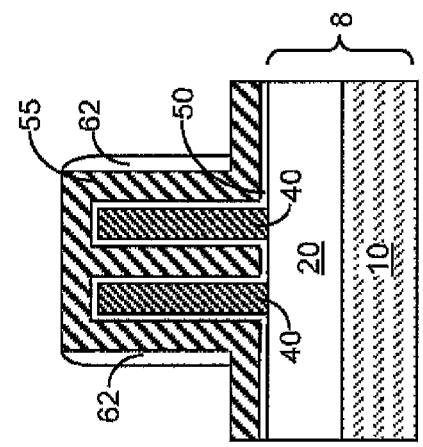
Figure 7A:
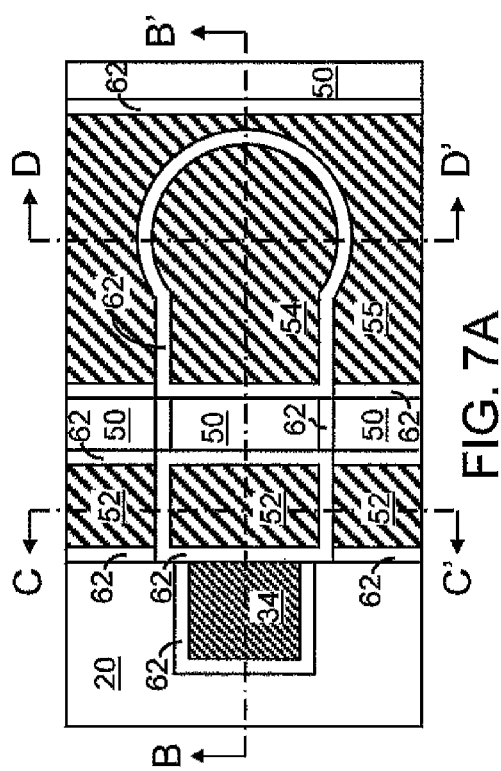
Figure 7B:
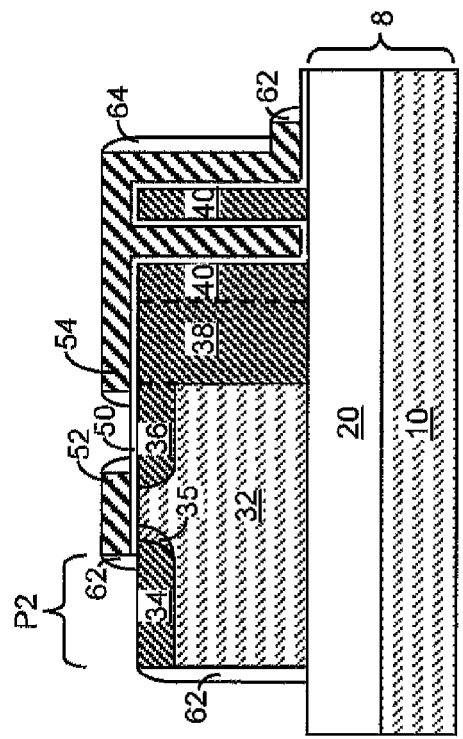

Referring to FIGS. 7A-7D, dopants of the second conductivity type are into the first exemplary semiconductor structure without employing an ion implantation mask. Dopants of the second conductivity type implanted into the second end portion P2 of the semiconductor fin (35, 32, 38) forms a drain region 34, which has a doping of the second conductivity type. The portion of the halo region 35 that is implanted by the dopants of the second conductivity type becomes a portion of the drain region 34. The volume of the halo region 35 is correspondingly reduced. Dopants of the second conductivity type are implanted into the portion of the semiconductor fin (35, 32, 38) between the gate electrode 52 and the outer electrode 54 to form a source region 36, which has a doping of the second conductivity type. The atomic concentration of the second conductivity type dopants in the in the drain region 34 and in the source region 36 may be from $1.0 \times 10^{19}/cm^3$ to $3.0 \times 10^{21}/cm^3$, and preferably from $1.0 \times 10^{20}/cm^3$ to $1.0 \times 10^{21}/cm^3$, although lesser and greater dopant concentrations are also contemplated herein.

Dopants of the second conductivity type are implanted into the gate electrode 52 and the outer electrode 54. In case the gate electrode 52 and the outer electrode 54 include a semiconductor material having a doping of the second conductivity type, the conductivity of the gate electrode 52 and the outer electrode 54 may be increased by the implantation of the dopants of the second conductivity type. In case the gate electrode 52 and the outer electrode 54 include a metallic material, the implantation of the second conductivity type dopants into the gate electrode 52 and the outer electrode 54 has no appreciable effect on the conductivity of the gate electrode 52 and the outer electrode 54.

The source region 36 is integrally formed with, and laterally abuts, the inner electrode fin portion 38. The source region 36 abuts the body region 32. The drain region 34 may abut the body region 32. A p-n junction is formed between the body region 32 and the collection of the source region 36 and the inner electrode fin portion 38. Another p-n junction is formed between the drain region 34 and the collection of the halo region 35 and the body region 32. Each of the source region 36, the drain region 34, and the body region 32 abuts a pair of sidewalls of the semiconductor fin (34, 35, 32, 36, 38). The source region 34 is encapsulated by the dielectric layer 50, the body region 32, and the inner electrode (38, 40).

Referring to FIGS. 8A-8D, at least one metal semiconductor alloy region is formed on exposed semiconductor surfaces by deposition of a metal layer (not shown) followed by an anneal that induces reaction of the metal layer with the underlying semiconductor material. A middle-of-line (MOL) dielectric layer 80 is omitted from the top-down view of FIG. 8A for clarity. Specifically, a drain-side metal semiconductor alloy region 76 is formed directly on the top surface of the drain region 34. Since the dielectric spacer 62 laterally abuts the entirety of the sidewalls of the semiconductor fin (34, 35, 32, 36, 38), formation of the drain-side metal semiconductor alloy region on the semiconductor fin (34, 35, 32, 36, 38) is limited to the surface of the drain region 34.

In case the surfaces of the gate electrode 52 and the outer electrode 54 include a metallic material, metal semiconductor alloy regions are not formed on the gate electrode 52 or the outer electrode 54. In case the surfaces of the gate electrode 52 and the outer electrode 54 include a semiconductor material, metal semiconductor alloy regions are formed directly on the gate electrode 52 and the outer electrode 54. The metal semiconductor alloy regions include a first gate-side metal semiconductor alloy region 72 vertically abutting a first portion of the gate electrode located above the semiconductor fin (34, 35, 32, 36, 38), a second gate-side metal semiconductor alloy region 73 vertically abutting a second portion of the gate electrode 52 that does not overlie the semiconductor fin (34, 35, 32, 36, 38), laterally abuts the dielectric spacer 62, and does not abut the first gate-side metal semiconductor alloy region 72. The metal semiconductor alloy regions further include a first outer-electrode-side metal semiconductor alloy region 74 vertically abutting a first portion of the outer electrode 54 located above the semiconductor column, which is the inner electrode column portion 40, and a second outer-electrode-side metal semiconductor alloy region 75 vertically abutting a second portion of the outer electrode 54 and laterally abutting the dielectric spacer 62.

A middle-of-line (MOL) dielectric layer 80, which may include a mobile ion barrier layer (not shown), is deposited over the semiconductor fin (34, 35, 32, 36, 38), the inner electrode column portion 40, and the various metal semiconductor alloy regions (76, 72, 73, 74, 75). The MOL dielectric layer 80 may include, for example, a CVD oxide such as undoped silicate glass (USG), borosilicate glass (BSG), phosphosilicate glass (PSG), fluorosilicate glass (FSG), borophosphosilicate glass (BPSG), or a combination thereof. Various contact via holes are formed in the MOL dielectric layer 80 and filled with metal to from various contact vias, which may include a drain-side contact via 86, a gate-side contact via 82, and an outer plate contact via 84.

Figure 9A:
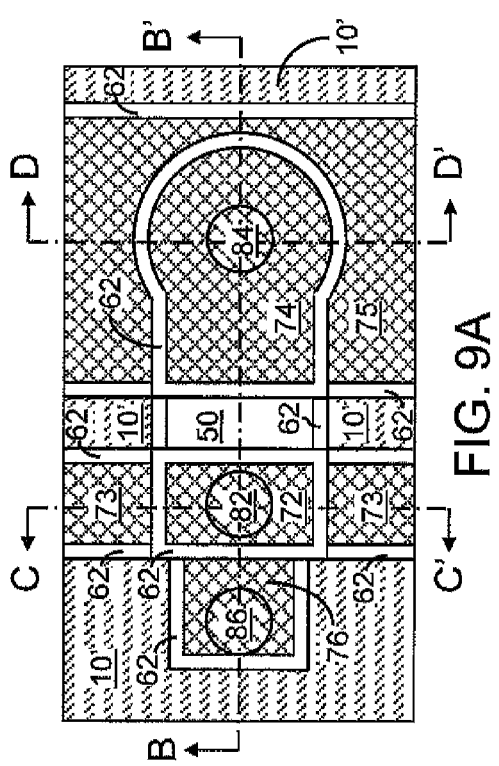
FIGS. 9A-9D are various views of a second exemplary semiconductor structure according to a second embodiment of the present invention.
Figure 9C:
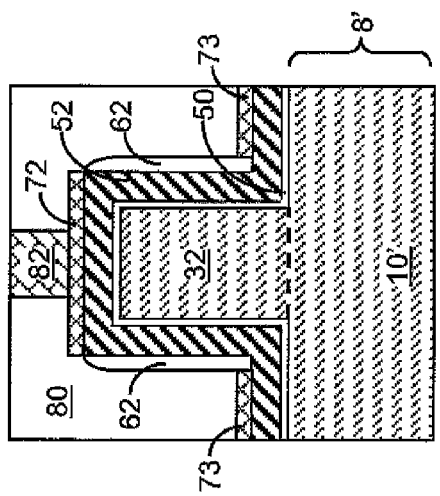
Figure 9B:
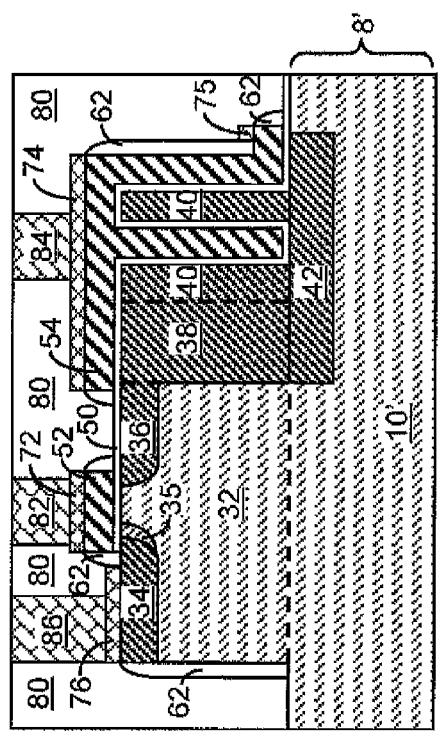
Figure 9D:
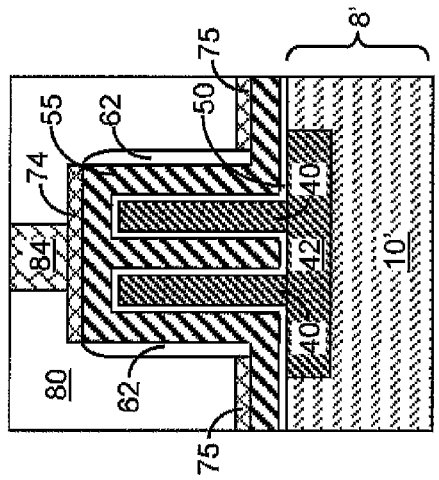

Referring to FIGS. 9A-9D, a second exemplary semiconductor structure according to a second embodiment of the present invention is derived from the first embodiment by employing a bulk substrate instead of an SOI substrate. In this case, a semiconductor fin and a semiconductor column are formed integrally with a substrate 8'. The substrate 8' includes a semiconductor layer 10' located in the substrate 8' vertically abutting the semiconductor fin and the semiconductor column. The semiconductor layer 10' has a doping of the first conductivity type. The semiconductor layer 10' is epitaxially aligned to the semiconductor fin and the semiconductor column. A doped semiconductor portion 42 is formed in the semiconductor layer 10' concurrently with formation of an inner electrode fin portion 42 and an inner electrode column portion 40. This processing step corresponds to the implantation dopants of the second conductivity type in FIGS. 2A-2D in the first embodiment. The doped semiconductor portion 42 has a doping of the second conductivity type and vertically abuts the bottom surfaces of the inner electrode fin portion 42 and the bottom surface of the inner electrode column portion 40. The doped semiconductor portion 42 provides electrical connection between the inner electrode fin portion 42 and the inner electrode column portion 40. A p-n junction is formed between the semiconductor layer 10' and the doped semiconductor region 42.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A semiconductor structure comprising:
    a field effect transistor located on a semiconductor fin that is located on a substrate;
    a semiconductor column of integral construction with said semiconductor fin;
    an inner electrode comprising a doped semiconductor material and located in said semiconductor column;
    a dielectric layer of unitary construction located on said semiconductor fin and said semiconductor column;
    an outer electrode located directly on said dielectric layer and overlying said semiconductor column; and
    a gate electrode located directly on said dielectric layer and overlying a middle portion of said semiconductor fin.

2. The semiconductor structure of claim 1, wherein a topmost surface of said semiconductor fin is coplanar with a topmost surface of said semiconductor column.

3. The semiconductor structure of claim 1, wherein said semiconductor fin and said semiconductor column comprise a same semiconductor material, are single crystalline, and are epitaxially aligned to each other.

4. The semiconductor structure of claim 1, wherein said semiconductor fin includes:
    a body region having a doping of a first conductivity type;
    a source region abutting said body region and said inner electrode and having a doping of a second conductivity type, wherein said second conductivity type is the opposite of said first conductivity type; and
    a drain region abutting said body region and having a doping of said second conductivity type.

5. The semiconductor structure of claim 4, wherein said semiconductor fin further comprises a halo region abutting said body region and said drain region and having of doping of said first conductivity type at a greater dopant concentration than said body region.

6. The semiconductor structure of claim 4, wherein each of said source region, said drain region, and said body region abuts a pair of sidewalls of said semiconductor fin.

7. The semiconductor structure of claim 4, wherein said dielectric layer, said body region, and said inner electrode encapsulates said source region.

8. The semiconductor structure of claim 1, wherein said outer electrode and said gate electrode comprise a same conductive material, and wherein a topmost surface of said gate electrode is substantially coplanar with a topmost surface of said outer electrode.

9. The semiconductor structure of claim 1, further comprising a dielectric spacer layer laterally abutting said drain region, said gate electrode, and said outer electrode.

10. The semiconductor structure of claim 9, further comprising:
    a drain-side metal semiconductor alloy region vertically abutting said drain region;
    a first gate-side metal semiconductor alloy region vertically abutting a first portion of said gate electrode located above said semiconductor fin; and
    a second gate-side metal semiconductor alloy region vertically abutting a second portion of said gate electrode, laterally abutting said dielectric spacer, and not abutting said first gate-side metal semiconductor alloy region.

11. The semiconductor structure of claim 9, further comprising:
- a first outer-electrode-side metal semiconductor alloy region vertically abutting a first portion of said outer electrode located above said semiconductor column; and
- a second outer-electrode-side metal semiconductor alloy region vertically abutting a second portion of said outer electrode and laterally abutting said dielectric spacer.

12. The semiconductor structure of claim 1, further comprising an insulator layer located in said substrate and vertically abutting said semiconductor fin and said semiconductor column.

13. The semiconductor structure of claim 1, further comprising:
- a semiconductor layer located in said substrate vertically abutting said semiconductor fin and said semiconductor column, wherein said semiconductor layer is epitaxially aligned to said semiconductor fin and said semiconductor column; and
- a doped semiconductor portion located in said semiconductor layer and abutting said inner electrode.

14. The semiconductor structure of claim 1, wherein said semiconductor column includes:
- an inner sidewall directly adjoined to an inner periphery of a top surface of said semiconductor column; and
- an outer sidewall directly adjoined to an outer periphery of said top surface of said semiconductor column.

15. A method of forming a semiconductor structure comprising:
- forming a semiconductor fin and a semiconductor column directly on a substrate, wherein said semiconductor column is of integral construction with said semiconductor fin;
- forming an inner electrode in said semiconductor column;
- forming a dielectric layer and a conductive layer on said semiconductor fin and said semiconductor column; and
- forming a field effect transistor and a capacitor, wherein said capacitor comprises said inner electrode, a first portion of said dielectric layer, and an outer electrode formed on said dielectric layer, wherein said outer electrode and a gate electrode of said field effect transistor are formed by patterning said conductive layer, and wherein a second portion of said dielectric layer is a gate dielectric of said field effect transistor.

16. The method of claim 15, wherein said first portion of said dielectric layer and said second portion of said dielectric layer are of integral and unitary construction.

17. The method of claim 15, wherein further comprising:
- patterning a semiconductor material layer having a doping of a first conductivity type to form said semiconductor fin and said semiconductor column; and
- implanting dopants of a second conductivity into said semiconductor column and a first end of said semiconductor fin abutting said semiconductor column, wherein a middle portion and a second end of said semiconductor fin are masked by a masking layer.

18. The method of claim 17, further comprising:
- forming a source region in a sub-portion of said middle portion of semiconductor fin by implanting dopants of said second conductivity type through a portion of said dielectric layer between said gate electrode and said outer electrode; and
- forming a drain region in said second end of said semiconductor fin by implanting dopants of said second conductivity type into said second end of said semiconductor fin.

19. The method of claim 18, further comprising:
- forming a masking layer having an edge over said gate electrode and covering said sub-portion of said middle portion of semiconductor fin, said first end of said semiconductor fin, and said semiconductor column; and
- removing said dielectric layer from above said second end of said semiconductor fin employing said masking layer as an etch mask.

20. The method of claim 18, further comprising forming a halo region in said semiconductor fin, wherein said halo region abuts a body region having a doping of said first conductivity type and said drain region, and wherein said halo region has a doping of said first conductivity type and has a greater dopant concentration than said body region.

* * * * *